United States Patent
Cao et al.

(10) Patent No.: US 12,193,270 B2
(45) Date of Patent: Jan. 7, 2025

(54) FLEXIBLE DISPLAY PANEL WITH OPEN PORES AND FLEXIBLE ARRAY SUBSTRATE

(71) Applicant: SHENZHEN CHINA STAR OPTOELECTRONICS SEMICONDUCTOR DISPLAY TECHNOLOGY CO., LTD., Shenzhen (CN)

(72) Inventors: Weiran Cao, Shenzhen (CN); Gaobo Lin, Shenzhen (CN); Yuanjun Hsu, Shenzhen (CN)

(*) Notice: Subject to any disclaimer, the term of this patent is extended or adjusted under 35 U.S.C. 154(b) by 0 days.

(21) Appl. No.: 17/623,604

(22) PCT Filed: Dec. 17, 2021

(86) PCT No.: PCT/CN2021/139360
§ 371 (c)(1),
(2) Date: Dec. 29, 2021

(87) PCT Pub. No.: WO2023/103060
PCT Pub. Date: Jun. 15, 2023

(65) Prior Publication Data
US 2024/0040834 A1    Feb. 1, 2024

(30) Foreign Application Priority Data
Dec. 8, 2021   (CN) .......................... 202111491391.8

(51) Int. Cl.
*H01L 27/14*   (2006.01)
*H10K 59/121*  (2023.01)
*H10K 59/124*  (2023.01)

(52) U.S. Cl.
CPC ....... *H10K 59/1213* (2023.02); *H10K 59/124* (2023.02)

(58) Field of Classification Search
CPC ............. H10K 59/1213; H10K 59/124; H10K 59/123; H10K 2102/311; Y02E 10/549
USPC ........................................... 257/59, 72
See application file for complete search history.

(56) References Cited

U.S. PATENT DOCUMENTS

| 9,911,618  | B2* | 3/2018 | Li   | H01L 29/41783 |
| 11,695,075 | B2* | 7/2023 | Zhu  | H01L 29/78618 |
|            |     |        |      | 257/288       |
| 11,950,455 | B2* | 4/2024 | Moon | H01L 27/1251  |

(Continued)

FOREIGN PATENT DOCUMENTS

| CN | 104779171 A |   | 7/2015 |
| CN | 106653810 A |   | 5/2017 |
| CN | 106898653 A | * | 6/2017 |

(Continued)

OTHER PUBLICATIONS

International Search Report in International application No. PCT/CN2021/139360, mailed on Aug. 25, 2022.

(Continued)

*Primary Examiner* — Tan N Tran

(57) ABSTRACT

A flexible display panel and a flexible array substrate are provided. The flexible display panel includes a flexible base and a thin film transistor. The thin film transistor includes an active layer, and the active layer is arranged on the flexible base. Open pores are formed in the active layer. The open pores penetrate through at least one part of the active layer.

9 Claims, 6 Drawing Sheets

(56) References Cited

U.S. PATENT DOCUMENTS

2008/0197356 A1    8/2008   Kim et al.
2021/0226137 A1    7/2021   Zhao

FOREIGN PATENT DOCUMENTS

| CN | 109037239 A | 12/2018 |
|----|-------------|---------|
| CN | 110289308 A | 9/2019 |
| JP | 2013118294 A | 6/2013 |

OTHER PUBLICATIONS

Written Opinion of the International Search Authority in International application No. PCT/CN2021/139360, mailed on Aug. 25, 2022.

Chinese Office Action issued in corresponding Chinese Patent Application No. 202111491391.8 dated Jan. 18, 2023, pp. 1-7.

\* cited by examiner

FLEXIBLE DISPLAY PANEL WITH OPEN PORES AND FLEXIBLE ARRAY SUBSTRATE

FIELD OF INVENTION

The present disclosure relates to the technical field of flexible displaying, and in particular to a flexible display panel and a flexible array substrate.

BACKGROUND OF INVENTION

In recent years, since flexible display panels can be bent or rolled, they can adapt to various display requirements and are more and more widely used. The flexible display panel includes a flexible array substrate, and the flexible array substrate includes an array composed of a plurality of thin film transistors. With the increasing requirements for the bending performance of the flexible display panel, conventional thin film transistors have been unable to meet the requirements of the flexible display panel.

SUMMARY OF INVENTION

Technical Problem

In view of this, the present disclosure provides a flexible display panel and a flexible array substrate that can improve the bending performance.

Technical Solution

The present disclosure provides a flexible display panel, which includes:
  a flexible base; and
  a thin film transistor, including an active layer arranged on the flexible base, open pores being formed in the active layer, and the open pores penetrating through at least one part of the active layer.

In an implementation, the active layer includes a channel region, a source electrode connecting part, and a drain electrode connecting part, and the source electrode connecting part and the drain electrode connecting part are located on two opposite sides of the channel region.

The thin film transistor further includes a source electrode and a drain electrode; the source electrode and the drain electrode are arranged on one side of the active layer away from the flexible base; the source electrode is connected with the source electrode connecting part; the drain electrode is connected with the drain electrode connecting part; and the open pores are located in at least one of the source electrode connecting part and the drain electrode connecting part.

In an implementation, at least one of the source electrode and the drain electrode extends into the open pores to be connected with the active layer.

In an implementation, the open pores are located in the source electrode connecting part and the drain electrode connecting part; and the open pores in the source electrode connecting part and the open pores in the drain electrode connecting part are disposed symmetrically with respect to the channel region.

In an implementation, the thin film transistor further includes an ohmic contact layer; the ohmic contact layer includes a first ohmic contact part and a second ohmic contact part; the first ohmic contact part is located between the source electrode connecting part and the source; the second ohmic contact part is located between the drain electrode connecting part and the drain electrode; and at least one of the first ohmic contact part and the second ohmic contact part extends into the open pores to be connected with the active layer.

In an implementation, the thin film transistor further includes a gate electrode and a gate electrode insulation layer; the gate electrode is located among the active layer, the source electrode and the drain; the gate electrode insulation layer is located between the gate electrode and the active layer; and an area of the open pore between 0.1 square micrometers and 20 square micrometers.

In an implementation, the active layer includes a channel region, and the open pores are located in the channel region.

In an implementation, the open pores in the channel region are disposed symmetrically.

In an implementation, the active layer includes a channel region, a source electrode connecting part, and a drain electrode connecting part; the source electrode connecting part and the drain electrode connecting part are located on two opposite sides of the channel region; the open pores are located in the channel region, the source electrode connecting part, and the drain electrode connecting part; the open pores in the channel region are disposed symmetrically; the open pores in the source electrode connecting part and the open pores in the drain electrode connecting part are disposed symmetrically with respect to the channel region; the source electrode and the drain electrode extend into the open pores to be connected with the active layer; the thin film transistor further includes a gate electrode insulation layer; the gate electrode insulation layer covers the channel region; and the gate electrode insulation layer fills the open pores.

In an implementation, the flexible display panel further includes a first electrode, a pixel defining layer, a light-emitting layer, and a second electrode; the first electrode is arranged on the thin film transistor; the pixel defining layer is arranged on one side of the first electrode away from the thin film transistor; an opening is formed in the pixel defining layer; the light-emitting layer is arranged in the opening; and the second electrode is covered on the pixel defining layer and the light-emitting layer.

The present disclosure provides a flexible array substrate, which includes:
  a flexible base; and
  a thin film transistor, including an active layer arranged on the flexible base, open pores being formed in the active layer, and the open pores penetrating through at least one part of the active layer.

In the flexible array substrate of an implementation, the active layer includes a channel region, a source electrode connecting part, and a drain electrode connecting part, and the source electrode connecting part and the drain electrode connecting part are located on two opposite sides of the channel region.

The thin film transistor further includes a source electrode and a drain electrode; the source electrode and the drain electrode are arranged on one side of the active layer away from the flexible base; the source electrode is connected with the source electrode connecting part; the drain electrode is connected with the drain electrode connecting part; and the open pores are located in at least one of the source electrode connecting part and the drain electrode connecting part.

In the flexible array substrate of an implementation, at least one of the source electrode and the drain electrode extends into the open pores to be connected with the active layer.

In the flexible array substrate of an implementation, the open pores are located in the source electrode connecting part and the drain electrode connecting part; and the open pores in the source electrode connecting part and the open pores in the drain electrode connecting part are disposed symmetrically with respect to the channel region.

In the flexible array substrate of an implementation, the thin film transistor further includes an ohmic contact layer; the ohmic contact layer includes a first ohmic contact part and a second ohmic contact part; the first ohmic contact part is located between the source electrode connecting part and the source; the second ohmic contact part is located between the drain electrode connecting part and the drain electrode; and at least one of the first ohmic contact part and the second ohmic contact part extends into the open pores to be connected with the active layer.

In the flexible array substrate of an implementation, the thin film transistor further includes a gate electrode and a gate electrode insulation layer; the gate electrode is located among the active layer, the source electrode and the drain; the gate electrode insulation layer is located between the gate electrode and the active layer; and an area of the open pore is between square micrometers and 20 square micrometers.

In the flexible array substrate of an implementation, the active layer includes a channel region, and the open pores are located in the channel region.

In the flexible array substrate of an implementation, the open pores in the channel region are disposed symmetrically.

In the flexible array substrate of an implementation, the active layer includes a channel region, a source electrode connecting part, and a drain electrode connecting part; the source electrode connecting part and the drain electrode connecting part are located on two opposite sides of the channel region; the open pores are located in the channel region, the source electrode connecting part, and the drain electrode connecting part; the open pores in the channel region are disposed symmetrically; the open pores in the source electrode connecting part and the open pores in the drain electrode connecting part are disposed symmetrically with respect to the channel region; the source electrode and the drain electrode extend into the open pores to be connected with the active layer; the thin film transistor further includes a gate electrode insulation layer; the gate electrode insulation layer covers the channel region; and the gate electrode insulation layer fills the open pores.

Beneficial Effects

In the present disclosure, the open pores are formed in the active layer, so that when a bending force is applied to the flexible display panel, stress on the thin film transistor is concentrated in the open pores, which can effectively reduce the damage of bending to the thin film transistor. Even if a crack is generated in the active layer due to extremely high bending force, the open pores in the active layer can also effectively prevent spreading of the crack and protect the thin film transistor.

BRIEF DESCRIPTION OF DRAWINGS

To describe the technical solutions in the present disclosure more clearly, the following briefly describes the accompanying drawings required for describing the implementations. Apparently, the accompanying drawings in the following description show merely some implementations of the present disclosure, and a person skilled in the art may still derive other drawings according to such accompanying drawings without creative efforts.

FIG. 7(c) is a schematic top view of a semiconductor layer in FIG. 7(b), and FIG. 7(e) is a schematic top view of an active layer in FIG. 7(d).

DETAILED DESCRIPTION OF PREFERRED EMBODIMENTS

Technical solutions of the present disclosure are clearly and completely described below with reference to the accompanying drawings in the implementations of the present disclosure. Apparently, the described implementations are merely some implementations rather than all the implementations of the present disclosure. All other implementations obtained by a person of ordinary skill in the art based on the implementations of the present disclosure without creative efforts shall fall within the protection scope of the present disclosure.

In the present disclosure, unless otherwise explicitly stipulated and defined, that a first feature is "above" or "under" a second feature may include that the first and second features are in direct contact, or may include that the first and second features are not in direct contact but in contact by using other features therebetween. In addition, that the first feature is "above", "over", or "on" the second feature may include that the first feature is directly above and obliquely above the second feature, or may merely indicate that the horizontal height of the first feature is higher than that of the second feature. That the first feature is "below", "under", and "beneath" the second feature may include that the first feature is right below the second feature and at an inclined bottom of the second feature, or may merely indicate that the horizontal position of the first feature is lower than that of the second feature. In addition, terms "first" and "second" are used merely for the purpose of description, and shall not be construed as indicating or implying relative importance or implying a quantity of indicated technical features. Therefore, features defining "first" and "second" may explicitly or implicitly include one or more such features.

The present disclosure provides a flexible display panel and a flexible array substrate. The display panel in the embodiments of the present disclosure can be used for mobile phones, tablet computers, e-readers, electronic display screens, notebook computers, mobile phones, augmented reality (AR)\virtual reality (VR) devices, media players, wearable devices, digital cameras, in-vehicle navigation devices, etc.

The display panel can be an Organic Light-emitting Diode (OLED) display panel, a Quantum Dot Light-emitting Diode (QLED) display panel, or a Micro Light-emitting Diode (Micro-LED) display panel, a Mini Light-emitting Diode (Mini-LED) display panel, or a liquid crystal display panel.

Figure 1:
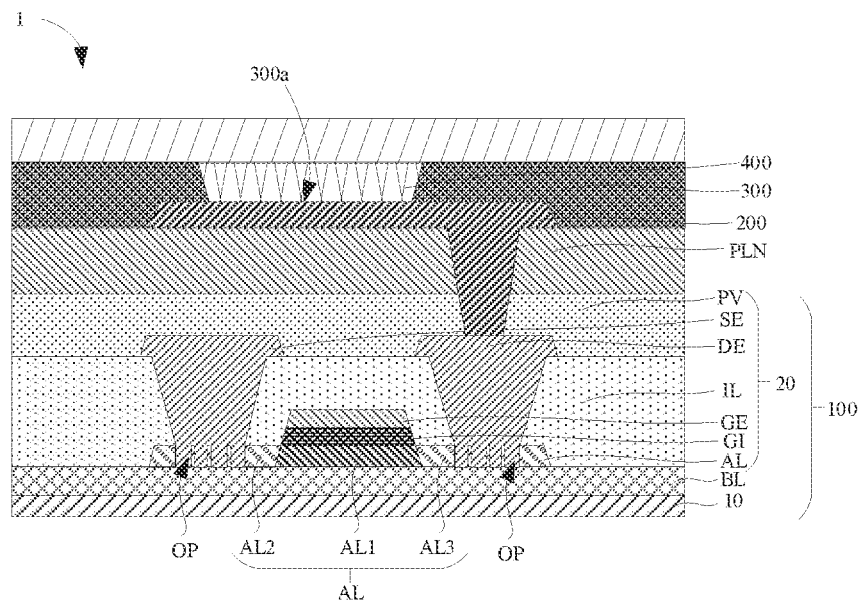
FIG. 1 is a schematic sectional diagram of a flexible display panel of a first implementation of the present disclosure.
Figure 2:
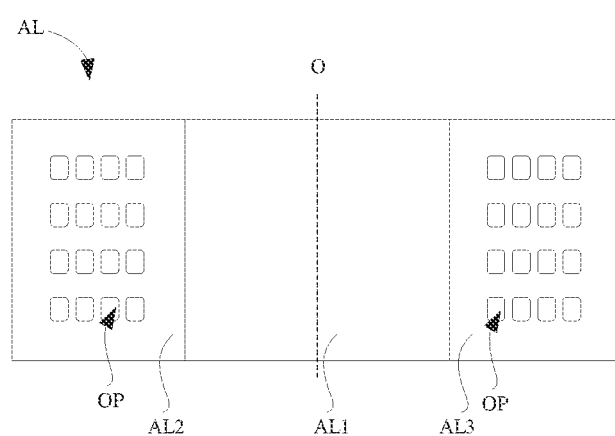
FIG. 2 is a schematic top view of an active layer of the flexible display panel of FIG. 1.

Referring to FIG. 1 and FIG. 2, the flexible display panel 1 includes a flexible array substrate 100. The flexible array substrate 100 includes a flexible base 10 and a thin film transistor 20 arranged on the flexible base 10. The flexible array substrate 100 may further include a buffer layer BL arranged between the flexible base 10 and the thin film transistor 20.

A material of the flexible base 10 is selected from one of polyimide (PI), polyethylene naphthalate (PEN), polyethylene terephthalate (PET), polyarylate (PAR), polycarbonate (PC), polyetherimide (PEI), and polyethersulfone (PES).

The thin film transistor 20 includes an active layer AL, a gate electrode GE, a gate electrode insulation layer GI, a source electrode SE, a drain electrode DE, an interlayer insulation layer IL, and a passivation layer PV. The active layer AL is arranged on the flexible base 10; the gate electrode GE is arranged on one side of the active layer AL away from the flexible base 10; the gate electrode insulation layer GI is arranged between the gate electrode GE and the active layer AL; the source electrode SE and drain electrode DE are arranged on sides of the gate electrode GE and the active layer AL away from flexible base 10; the interlayer insulation layer IL is arranged among the source electrode SE, the drain electrode DE, and the active layer AL; and the passivation layer PV is covered on sides of the source electrode SE and the drain electrode DE away from the flexible base 10. The source electrode SE and the drain electrode DE are respectively connected with two ends of the active layer AL through contact holes formed in the interlayer insulation layer IL.

Open pores OP are formed in the active layer, and the open pores OP penetrate through at least one part of the active layer AL. The open pore OP may be a through hole or a blind hole, that is, the open pore OP may completely penetrate through the active layer AL, or may penetrate through a part of the active layer AL. By means of forming the open pores OP in the active layer AL, when a bending force is applied to the flexible display panel 1, stress on the thin film transistor 20 is concentrated in the open pores OP, which can effectively reduce the damage of bending to the thin film transistor 20. Even if a crack is generated in the active layer AL due to extremely high bending force, the open pores OP in the active layer AL can also effectively prevent spreading of the crack and protect the thin film transistor 20.

The active layer AL includes a channel region AL1, a source electrode connecting part AL2, and a drain electrode connecting part AL3. The source electrode connecting part AL2 and the drain electrode connecting part AL3 are located on two opposite sides of the channel region AL1. The source electrode SE is connected with the source electrode connecting part AL2, and the drain electrode DE is connected with the drain electrode connecting part AL3.

The open pores OP may be located in at least one of the channel region AL1, the source electrode connecting part AL2, and the drain electrode connecting part AL3. When the open pores OP are located in at least one of the source electrode connecting part AL2 and the drain electrode connecting part AL3, at least one of the source electrode SE and the drain electrode DE extends into the open pores OP to be connected with the active layer AL. In this implementation, the open pores OP are located in the source electrode connecting part AL2 and the drain electrode connecting part AL3. The source electrode SE extends into the open pores OP of the source electrode connecting part AL2 to be connected with the source electrode connecting part AL2, and the drain electrode DE extends into the open pores OP of the drain electrode connecting part AL3 to be connected with the drain electrode connecting part AL3. When the open pores OP are located in the channel region AL1, a film layer covering one side of the channel region AL1 away from the flexible base 10 can extend into the open pores OP to fill the open pores OP. The film layer covering the side of the channel region AL1 away from the flexible base 10 is, for example, a gate electrode insulation layer in a top-gate transistor, and is, for example, a source electrode and drain electrode, an ohmic contact layer, or a channel protection layer in a bottom-gate transistor. The setting of the open pores OP can enlarge overlap areas between the active layer AL and the source electrode SE as well as between the active layer AL and the drain electrode DE, reduce the contact resistance, and improve the device performance of the thin film transistor 20.

The number and arrangement of the open pores OP are not limited in the present disclosure. Alternatively, in this implementation, 16 open pores OP may be respectively formed in the source electrode connecting part AL2 and the drain electrode connecting part AL3. The 16 open pores OP in the source electrode connecting part AL2 are arranged in a matrix, and the 16 open pores OP in the drain electrode connecting part AL3 are also arranged in a matrix. Further, the open pores OP in the source electrode connecting part AL2 and the open pores OP in the drain electrode connecting part AL3 can be disposed symmetrically with respect to the channel region AL1, which can avoid damage to the active layer due to stress relief dislocation. Specifically, the symmetrical arrangement with respect to the channel region AL1 means that when the channel region AL1 is a symmetrical pattern, the open pores OP in the source electrode connecting part AL2 and the open pores OP in the drain electrode connecting part AL3 are symmetrical with respect to a symmetry axis O of the channel region ALL When the channel region AL1 is not a standard symmetrical pattern, the open pores OP in the source electrode connecting part AL2 and the open pores OP in the drain electrode connecting part AL3 may be disposed symmetrically with respect to a center line of the channel region AL1 serving as the symmetry axis. The shape of the open pore OP may be circular or square. In order to prevent the open pore OP from being too large and affecting the function of the active layer AL, an area of the open pore OP may be 0.1 square micrometers to 20 square micrometers. Alternatively, when the number of the open pore OP is one, the area of the open pore OP may be 20 square micrometers, for example, a rectangular hole of 4 μm×5 μm.

In this implementation, a self-alignment type top-gate thin film transistor will be described as an example. It can be understood that, in other implementations of the present disclosure, the thin film transistor may also be a bottom-gate thin film transistor.

It should be noted that although only one thin film transistor 20 is shown in the figure, the flexible array substrate 100 may include a plurality of thin film transistors 20. A drive circuit of an OLED display panel may be 2T1C, 3T1C, 5T1C, or 7T1C. According to different structures of a pixel drive circuit, the type and number of thin film transistors 20 included in the flexible array substrate 100 may be different. In the present disclosure, open pores OP may be formed in the active layers AL of part of the thin film transistors 20, or open pores OP may be formed in the active layers AL of all the thin film transistors 20, or open pores OP may also be selectively formed in the thin film transistors 20 in a display region and/or a non-display region.

The flexible display panel 1 further includes a passivation layer PLN, a first electrode 200, a pixel defining layer 300, a light-emitting layer 400, and a second electrode 500. The passivation layer PLN covers the flexible array substrate 100; the first electrode 200 is arranged on one side of the passivation layer PLN away from the flexible array substrate 100; the pixel defining layer 300 is arranged on one side of the first electrode 200 away from the flexible array substrate 100; an opening 300a is formed in the pixel defining layer 300; the light-emitting layer 400 is arranged in the opening 300a; and the second electrode 500 covers the pixel defining layer 300 and the light-emitting layer 400. The first electrode 200 may be an anode and the second electrode 500 may be a cathode; or the first electrode 200 may be a cathode and the second electrode 500 may be an anode. A first via VIA1 is formed in the passivation layer PV, and a second via VIA2 is formed in an organic flat layer 30. The second via VIA2 is in communication with the first via VIA1. The first electrode 200 overlaps the thin film transistor through the second via hole VIA2 and the first via hole VIA1.

Figure 3:
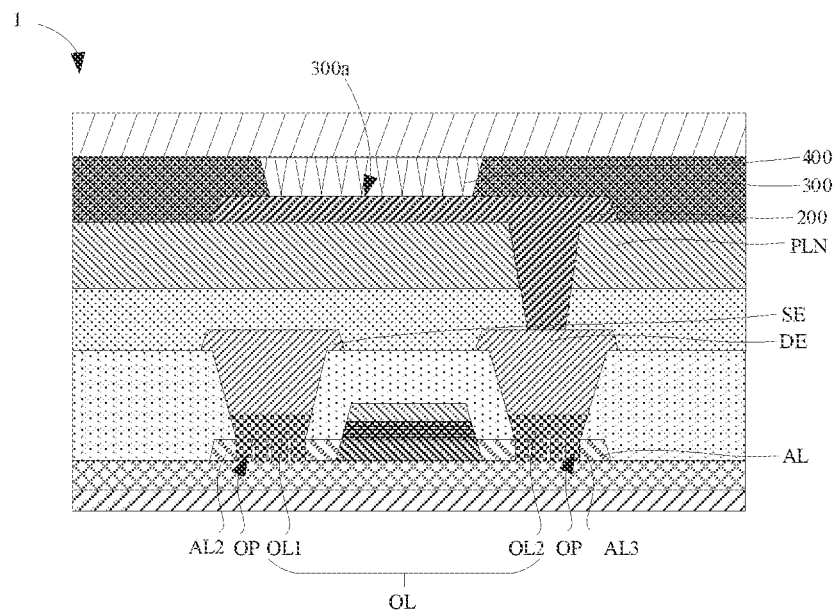
FIG. 3 is a schematic sectional diagram of a flexible display panel of a second implementation of the present disclosure.

Referring to FIG. 3, a difference between the flexible display panel of the second implementation of the present disclosure and the flexible display panel of the first implementation is as follows.

The thin film transistor 20 further includes an ohmic contact layer OL, and the ohmic contact layer OL includes a first ohmic contact part OL1 and a second ohmic contact part OL2. The first ohmic contact part OL1 is located between the source electrode connecting part AL2 and the source electrode SE; the second ohmic contact part OL2 is located between the drain electrode connecting part AL3 and the drain electrode DE; and the first ohmic contact part OL1 and the second ohmic contact part OL2 extend into the open pores OP to be connected with the active layer AL.

It can be understood that in this implementation, the open pores OP are formed in both the source electrode connecting part AL2 and the drain electrode connecting part AL3. In other implementation, the open pores OP may be formed in one of the source electrode connecting part AL2 and the drain electrode connecting part AL3.

Figure 4:
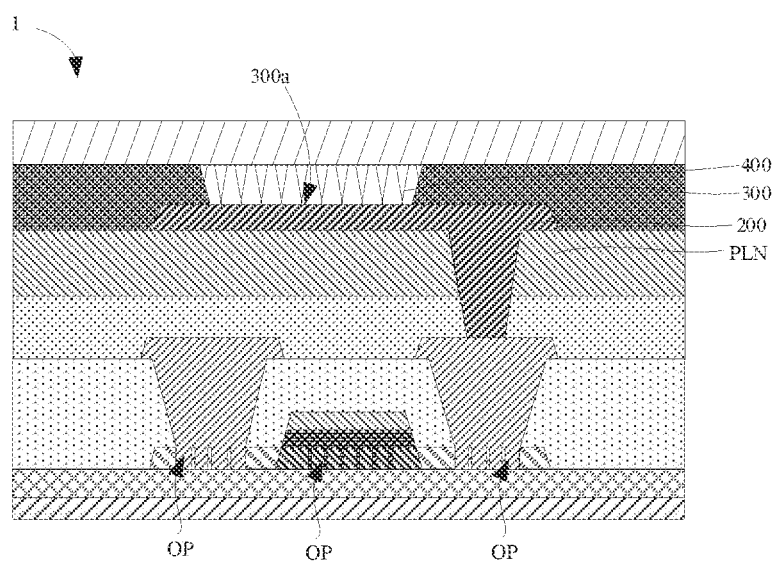
FIG. 4 is a schematic sectional diagram of a flexible display panel of a third implementation of the present disclosure.
Figure 5:
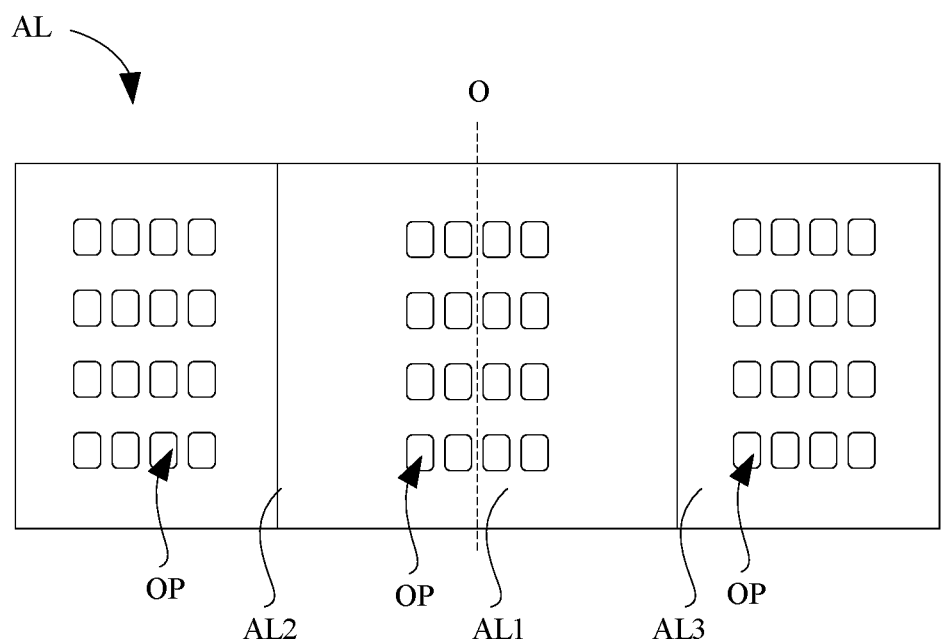
FIG. 5 is a schematic top view of an active layer of the flexible display panel of FIG. 4.

Referring to FIG. 4 and FIG. 5, a difference between the flexible display panel of the third implementation of the present disclosure and the flexible display panel of the first implementation is as follows.

The open pores OP are located not only in the source electrode connecting part AL2 and the drain electrode connecting part AL3, but also in the channel region AL1. The gate electrode insulation layer GI covers the channel region AL1, and the gate electrode insulation layer GI fills the open pores OP. Further, the open pores OP in the channel region AL1 are disposed symmetrically, which can avoid damage to the active layer due to stress relief dislocation. Specifically, the symmetrical arrangement with respect to the channel region AL1 means that when the channel region AL1 is a symmetrical pattern, the open pores OP in the channel region AL1 are symmetrical with respect to the symmetry axis O of the channel region AL'. When the channel region AL1 is not a standard symmetrical pattern, the open pores OP in the channel region AL1 may be arranged approximately symmetrically with respect to the center line of the channel region AL1 serving as the symmetry axis.

It can be understood that although the third implementation discloses that the open pores OP are formed in the channel region AL1, the source electrode connecting part AL2, and the drain electrode connecting part AL3. However, in other implementations of the present disclosure, the open pores OP are formed in the channel region AL1 only, and no open pore OP is formed in the source electrode connecting part AL2 and the drain electrode connecting part AL3.

Figure 6:
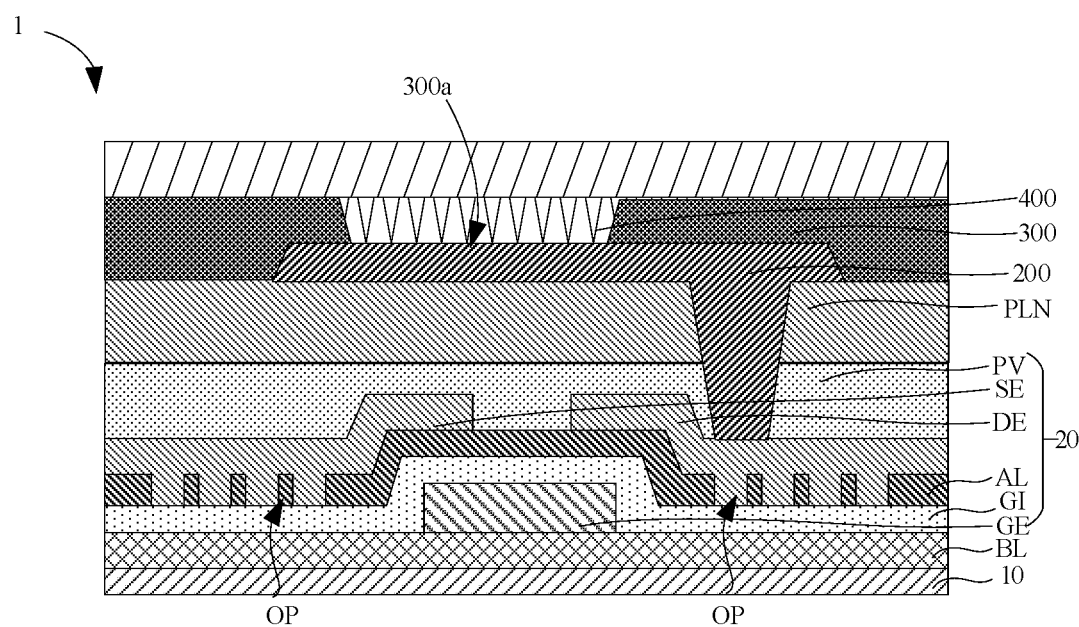
FIG. 6 is a schematic sectional diagram of a flexible display panel of a fourth implementation of the present disclosure.

Referring to FIG. 6, a difference between the flexible display panel of the fourth implementation of the present disclosure and the flexible display panel of the first implementation is as follows.

The thin film transistor 20 may also be a bottom-gate thin film transistor. The thin film transistor 20 includes a gate electrode GE, a gate electrode insulation layer GI, an active layer AL, a source electrode SE, a drain electrode DE, and a passivation layer PV. The gate electrode GE is arranged on the flexible base 10; the active layer AL is arranged on one side of the gate electrode GE away from the flexible base 10; the gate electrode insulation layer GI is arranged between the gate electrode GE and the active layer AL and covers the gate electrode GE and the flexible base 10; the source electrode SE and the drain electrode DE are arranged on one side of the active layer AL away from the gate electrode GE and are respectively connected with two ends of the active layer AL; and the passivation layer PV covers sides of the source electrode SE and the drain electrode DE away from the active layer AL.

What is the same as that of the first implementation, the open pores OP may be located in the source electrode connecting part AL2 and the drain electrode connecting part AL3. The source electrode SE extends into the open pores OP of the source electrode connecting part AL2 to be connected with the source electrode connecting part AL2, and the drain electrode DE extends into the open pores OP of the drain electrode connecting part AL3 to be connected with the drain electrode connecting part AL3.

Figure 7A:
FIG. 7(a) to FIG. 7(h) are schematic diagrams of steps of a method for manufacturing a flexible display panel of the present disclosure, where

The present disclosure further provides a method for manufacturing a flexible display panel, which is used for manufacturing the above-mentioned flexible display panel. As shown in FIG. 7(a) to FIG. 7(h), the method for manufacturing the flexible display panel includes the following steps:

Step 101: referring to FIG. 7(a), a flexible base 10 is provided.

A material of the flexible base 10 is selected from one or more of polyimide (PI), polyethylene naphthalate (PEN), polyethylene terephthalate (PET), polyarylate (PAR), polycarbonate (PC), polyetherimide (PEI), and polyethersulfone (PES).

Step 102: a buffer layer BL is deposited. A material of the buffer layer may be a single layer of silicon nitride, a single layer of silicon oxide, or a two-layer or more-layer film layer of silicon oxide, silicon nitride and silicon oxide. A thickness of the buffer layer is 1000 angstroms to 5000 angstroms.

Figure 7B:
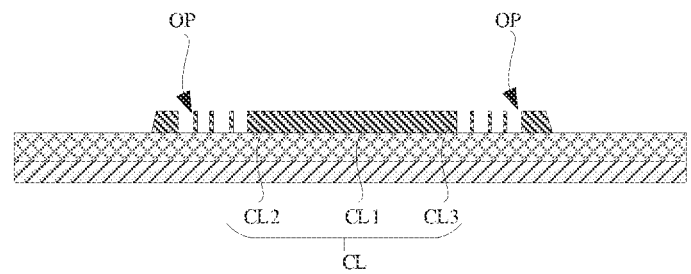
Figure 7C:
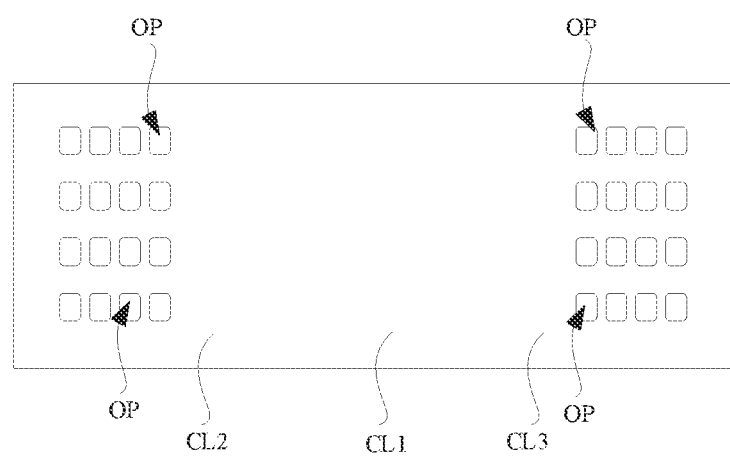
Figure 7D:
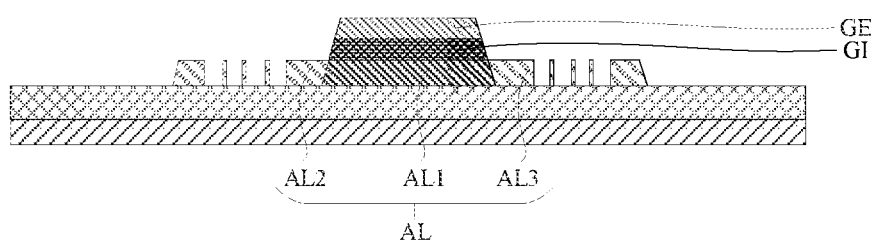
Figure 7E:
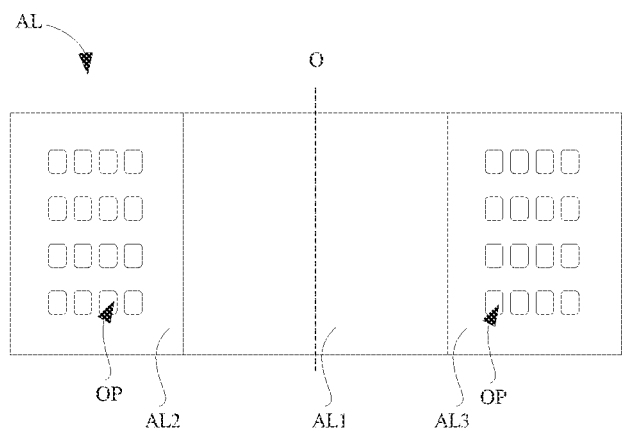

Step 103: referring to FIG. 7(b) and FIG. 7(c), a semiconductor material layer CL is deposited. A material of the semiconductor material layer CL may be IGZO, ITZO or IGZTO. A thickness of the semiconductor material layer CL is 100 angstroms to 1000 angstroms. The semiconductor material layer CL is divided into a channel region CL1, a source electrode overlap region CL2, and a drain electrode overlap region CL3. Open pores OP are respectively formed in the source electrode overlap region CL2 and the drain electrode overlap region CL3. The open pores OP in the source electrode connecting part AL2 and the open pores OP in the drain electrode connecting part AL3 are disposed symmetrically with respect to the channel region AL1. The shape of the open pore OP may be circular or square. In order to prevent the open pore OP from being too large and affecting the function of the active layer, an area of the open pore OP may be 0.1 square micrometers to 20 square micrometers. Alternatively, when the number of the open pore OP is one, the area of the open pore OP may be 20 square micrometers, for example, a rectangular hole of 4 μm×5 μm. Step 104: referring to FIG. 7(d) and FIG. 7(e), a gate electrode insulation material layer (not shown) is deposited on the active layer AL. A material of the gate electrode insulation material layer is silicon oxide with a thickness of 1000 angstroms to 3000 angstroms.

Step 105: a gate electrode metal layer (not shown) is deposited on the gate electrode insulation material layer. A material of the gate electrode metal layer may be a single layer of Mo, Al, Cu, Ti and the like, or may be a multilayer metal such as Mo/Al/Mo, Al/Mo, Mo/Cu, and MoTi/Cu, with a thickness of 500 angstroms to 10000 angstroms.

Step 106: a photomask is used to define the gate electrode GE and the gate electrode insulation layer GI; wet etching is used to etch the gate electrode metal layer first, and then a gate pattern is used for self-alignment; and the gate electrode insulation layer GI is formed by dry etching.

Step 107: the semiconductor material layer without the protection of the gate electrode insulation layer GI is conducted by plasma treatment to form N-doped conductor regions used as a source electrode connecting part AL2 and a drain electrode connecting part AL3 which are in contact with the source electrode and the drain electrode. The semiconductor material layer below the gate electrode insulation layer GI is not treated and is used as a channel region AL1 of a thin film transistor 20.

Figure 7F:
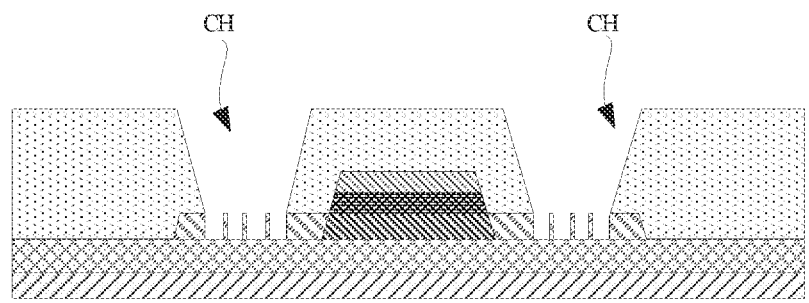

Step 108: referring to FIG. 7(f), a silicon oxide film is deposited to serve as an interlayer insulation layer IL with a thickness of 3000 angstroms to 10000 angstroms, and contact holes CH of the source electrode, the drain electrode, and the active layer AL are etched in the interlayer insulation layer IL.

Figure 7G:
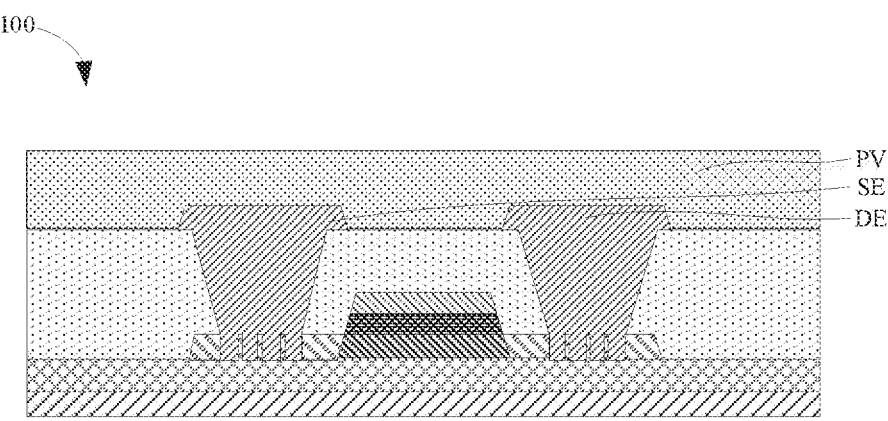

Step 109: referring to FIG. 7(g), a source and drain electrode metal layer is deposited, which has a single-layer or multilayer structure, such as Cu, Al, MoTi/Cu, Ti/Al/Ti, Mo/Al/Mo, MoTi/Cu/MoTi, Mo/Cu/Mo, i/Cu/Ti and the like, and a thickness of the source and drain electrode metal layer is 2000-10000 Å; the source electrode SE and drain electrode DE are formed by patterning and are respectively connected with the conducted source electrode connecting part AL2 and drain electrode connecting part AL3 through the contact holes CH.

Step 110: a passivation layer PV is deposited. The passivation layer PV may be a silicon oxide thin film with a thickness of 1000 angstroms to 5000 angstroms.

Figure 7H:
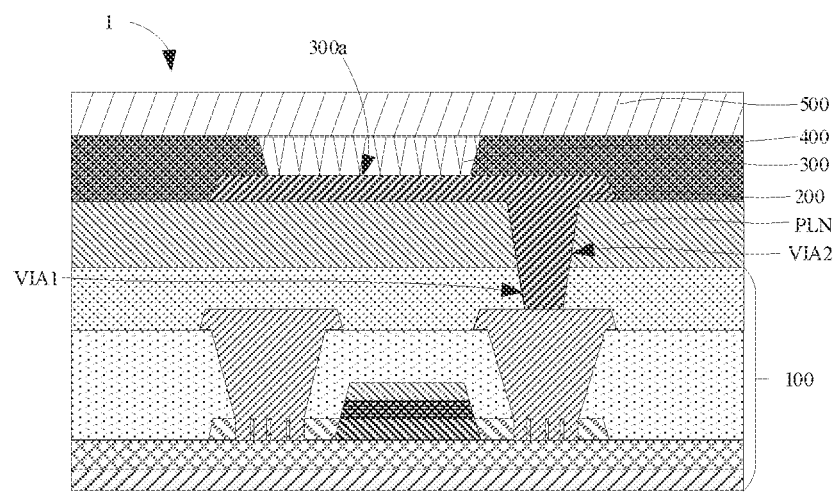

Step 111: referring to FIG. 7(h), a first via VIA1 is formed in the passivation layer PV.

Step 112: an organic photoresist material is deposited to serve as an organic flat layer PLN, and a second via VIA2 is formed in the organic flat layer PLN. The second via VIA2 is in communication with the first via VIA1. It can be a photoresist layer of different compositions. A thickness of the organic flat layer PLN is 10000 angstroms to 50000 angstroms, and the organic flat layer PLN fills the vias VIA.

Step 113: an anode 200 is deposited. The anode 200 includes a metal material with high reflectivity, including, but not limited to, ITO/Ag/ITO, IZO/Ag/IZO, ITO/Al/ITO or IZO/Al/IZO, and the anode 200 overlaps the thin film transistor 20 through the second via VIA2 and the first via VIA1.

Step 114: a pixel defining layer 300 is formed. A thickness of the pixel defining layer 300 is 10000 angstroms to 20000 angstroms, and an opening 300a is defined by a yellow light process.

Step 115: a light-emitting layer 400 is formed in the opening 300a.

Step 116: a cathode 500 is formed on the light-emitting layer 400 and the pixel defining layer 300, thus obtaining a complete display panel.

The foregoing specific steps describe the method for manufacturing the flexible display panel of the first implementation of the present disclosure. The manufacturing methods of the flexible display panel of the second implementation to the fourth implementation of the present disclosure can be adjusted in the foregoing manufacturing methods, and the descriptions are omitted herein.

The implementations of the present disclosure are described in detail above. The principles and implementations of the present disclosure are described through specific examples in this specification, and the descriptions of the foregoing implementations are merely intended to help understand the present disclosure. Meanwhile, a person skilled in the art may make modifications to the specific implementations and application scopes according to the ideas of the present disclosure. In conclusion, the content of this specification should not be construed as a limitation to the present disclosure.

What is claimed is:

1. A flexible display panel, comprising:
   a flexible base; and
   a thin film transistor, comprising an active layer arranged on the flexible base, wherein a plurality of open pores are defined in the active layer, and the open pores penetrate through at least one part of the active layer;
   wherein the active layer comprises a channel region, a source electrode connecting part, and a drain electrode connecting part, and the source electrode connecting part and the drain electrode connecting part are located on two opposite sides of the channel region;
   the thin film transistor further comprises a source electrode and a drain electrode; the source electrode and the drain electrode are arranged on one side of the active layer away from the flexible base, the source electrode is connected to the source electrode connecting part, and the drain electrode is connected to the drain electrode connecting part; and
   at least a part of the open pores are located in and completely penetrate at least one of the source electrode connecting part and the drain electrode connecting part.

2. The flexible display panel according to claim 1, wherein at least one of the source electrode and the drain electrode extends into the at least a part of the open pores to be connected to the active layer.

3. The flexible display panel according to claim 1, wherein the at least a part of the open pores are located in the source electrode connecting part and the drain electrode connecting part; and the at least a part of the open pores in the source electrode connecting part and in the drain electrode connecting part are disposed symmetrically with respect to the channel region.

4. The flexible display panel according to claim 1, wherein the thin film transistor further comprises an ohmic contact layer; the ohmic contact layer comprises a first ohmic contact part and a second ohmic contact part; the first ohmic contact part is located between the source electrode connecting part and the source; the second ohmic contact part is located between the drain electrode connecting part and the drain; and at least one of the first ohmic contact part and the second ohmic contact part extends into the open pores to be connected to the active layer.

5. The flexible display panel according to claim 1, wherein the thin film transistor further comprises a gate electrode and a gate electrode insulation layer; the gate electrode is located among the active layer, the source electrode and the drain electrode; the gate electrode insulation layer is located between the gate electrode and the active layer; and an area of the open pores is between 0.1 square micrometers and 20 square micrometers.

6. The flexible display panel according to claim 1, wherein another part of the open pores are located in the channel region.

7. The flexible display panel according to claim 6, wherein the another part of the open pores in the channel region are disposed symmetrically.

8. The flexible display panel according to claim 1, wherein another part of the open pores are located in the channel region, and the another part of the open pores in the channel region are disposed symmetrically;

the at least a part of the open pores are located in the source electrode connecting part and the drain electrode connecting part, and the at least a part of the open pores in the source electrode connecting part and in the drain electrode connecting part are disposed symmetrically with respect to the channel region; and the source electrode and the drain electrode extend into the at least a part of the open pores to be connected to the active layer; the thin film transistor further comprises a gate electrode insulation layer; the gate electrode insulation layer covers the channel region, and the gate electrode insulation layer fills the another part of the open pores in the channel region.

9. The flexible display panel according to claim 8, wherein the flexible display panel further comprises a first electrode, a pixel defining layer, a light-emitting layer, and a second electrode; the first electrode is arranged on the thin film transistor; the pixel defining layer is arranged on one side of the first electrode away from the thin film transistor; an opening is formed in the pixel defining layer; the light-emitting layer is arranged in the opening; and the second electrode is covered on the pixel defining layer and the light-emitting layer.

\* \* \* \* \*